Figure 1A:
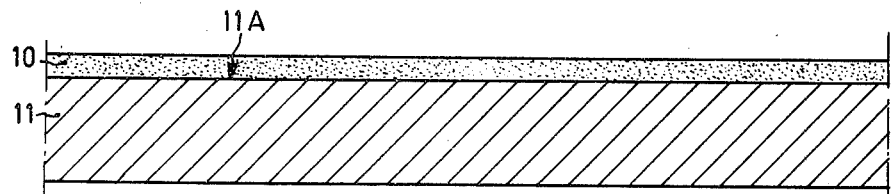

United States Patent [19]

Monfret

[11] 3,951,694
[45] Apr. 20, 1976

[54] METHOD OF MANUFACTURING A SEMICONDUCTOR DEVICE AND DEVICE MANUFACTURED ACCORDING TO THE METHOD

[75] Inventor: Alain Gerard Monfret, Echirolles, France

[73] Assignee: U.S. Philips Corporation, New York, N.Y.

[22] Filed: Aug. 20, 1974

[21] Appl. No.: 498,913

[30] Foreign Application Priority Data
Aug. 21, 1973 France .............................. 73.30278

[52] U.S. Cl. .................................. 148/1.5; 29/578; 156/17; 357/9; 357/91; 148/187
[51] Int. Cl.² ...................................... H01L 21/26
[58] Field of Search ............. 148/1.5, 187; 29/578, 29/584; 156/17; 357/9

[56] References Cited
UNITED STATES PATENTS

| | | |
|---|---|---|
| 3,413,531 | 11/1968 | Leith .............................. 148/1.5 X |
| 3,431,150 | 3/1969 | Dolan, Jr. et al. ................... 148/1.5 |
| 3,457,632 | 7/1969 | Dolan, Jr. et al. ............... 148/1.5 X |
| 3,589,949 | 6/1971 | Nelson .............................. 148/1.5 |
| 3,704,177 | 11/1972 | Beale ................................ 148/1.5 |
| 3,713,922 | 1/1973 | Lepselter ...................... 148/1.5 X |

Primary Examiner—L. Dewayne Rutledge
Assistant Examiner—J. M. Davis
Attorney, Agent, or Firm—Frank R. Trifari; Leon Nigohosian

[57] ABSTRACT

A method of manufacturing a semiconductor device by means of doping via a mask. According to the invention a mask is used which is manufactured by providing one or more "first" apertures in a masking layer, after which islands of an isotropically growing material are grown in the said apertures, after which the parts of the masking layer present between the islands are removed and finally the said islands themselves are removed.

9 Claims, 18 Drawing Figures

METHOD OF MANUFACTURING A SEMICONDUCTOR DEVICE AND DEVICE MANUFACTURED ACCORDING TO THE METHOD

The invention relates to a method of manufacturing a semiconductor device in which a masking layer is provided on a surface of a semiconductor body after which at least two apertures are provided in said masking layer, doped zones being provided in the semiconductor body via said apertures by the introduction of at least one dopant.

An "aperture" in a masking layer is to be understood to mean broadly in this application a surface part of the semiconductor body not covered by the material of the masking layer, in which said surface part need not be bounded throughout its circumference by the masking layer but may also be bounded, for example, by the edge of the semiconductor body.

Furthermore, a "dopant" is to be understood to mean not only a donor or acceptor but broadly a material which influences the electric properties of the semiconductor material. Said properties may be the conductivity type and the resistivity but also, for example, the lifetime of the charge carriers, or a combination of said properties.

Furthermore, the said introduction of a dopant may take place according to the methods to be used conventionally for the purpose in semiconductor technology, for example, diffusion from the gaseous phase, diffusion from a doped layer (for example an oxide layer) or ion implantation.

In doping semiconductor materials to manufacture a semiconductor device, masks are very often used which are provided on the semiconductor surface. It is known that in that case a masking layer is formed (usually a film of silicon dioxide or of silicon nitride) on the said surface, after which a given pattern is provided in the said masking layer or film by using a photolithographic etching process. In this method it is possible to provide windows in a layer of silicon dioxide, of silicon nitride or of another material, which windows have very small dimensions and are situated very close together. When proceeding very carefully, it is possible while using said method to provide apertures having dimensions which may be as small as 1.5 to $2\mu$, said apertures being spaced apart by "dams" the width of which is not larger than $2\mu$ to $3\mu$. Said numerical values, however, are limit values and with the conventional photoetching process alone it is not possible to remain below said values.

It is to be noted that it is possible via ion etching to form apertures having dimensions of $1\mu$ and separated from each other by dams the width of which is 1.5 to $2\mu$.

The ever proceeding miniaturization, particularly in the field of the integrated circuits, makes it necessary to find masks for the doping process which make it possible to obtain better results than the results obtained hitherto.

It is a particular object of the invention to considerably reduce the width of the dams between the apertures in the mask via which the doping takes place.

According to the invention, a method of the type described in the preamble is therefore characterized in that first at least one first aperture is provided in the masking layer, that an island of an isotropically growing material is grown in said first aperture on the semiconductor surface until said island extends over the edge of the aperture on the masking layer and forms thereon a collar along the edge of the aperture, that the parts of the masking layer not covered by the islands are then removed so that a mask having at least one second aperture is obtained, after which the islands are removed, and that at least one dopant is introduced into the semiconductor body through the first and second apertures.

When using the method according to the invention, adjacent doping windows corresponding to the said first and second apertures are separated only by a dam the width of which can be approximately $0.5\mu$, whereas according to the conventional method the said width is at least 2 to $3\mu$, as already stated above.

For example, let it be assumed that in a first stage first apertures having a dimension of $2\mu$ have been formed in the masking layer and that the edges of said apertures present in the proximity of each other are separated by a distance which is also $2\mu$ (said distances are measured at the surface of the film; it is known that the apertures at the base plane of the film are usually smaller than $2\mu$ whereas at that area the distance between the apertures is larger than $2\mu$ which is due to the inclination of the walls of the apertures). In said first apertures the said islands with collars are grown and said growth process is continued until the collars project, for example, $0.5\mu$ beyond the upper edge of the apertures. The film is then etched to remove the film parts between the said islands, so that "second" apertures are obtained which are present between the first apertures. The islands with collars are then removed. The structure then shows apertures the dimension of which at the surface of the film is $2\mu$ (first apertures) or $1\mu$ (second apertures), the distance between the centres of the first and second apertures being $2\mu$ and said apertures being separated by dams the width of which is $0.5\mu$.

On the contrary, when using a doping mask manufactured according to the conventional methods, not only the dimension of the apertures cannot be smaller than $1.5\mu$ to $2\mu$, but also the distance between the centres of the doping apertures cannot be less than approximately $3.5\mu$. Even when ion etching is used, the said distance between the centres of the apertures cannot become smaller than approximately $2.5\mu$.

The method according to the invention of manufacturing a semiconductor device by doping via a mask manufactured in the described manner thus has the great advantage that the apertures can be provided very close together. The method according to the invention hence permits a considerably smaller distance between the various components as is required by the miniaturization of the semiconductor devices.

Since the growth rate of an isotropically growing material is the same in all directions, the growing of the islands in the initially provided first apertures in the masking layers occurs in the first instance only in one direction, namely the direction which is transverse to the semiconductor surface, said growing occurring from the surface of the said substrate and continuing to the upper level of the masking layer. From this level the growth of the islands then occurs simultaneously in the transverse and the lateral direction so that in this manner collars are obtained on the said masking layer or film, the width of which collars corresponds approximately to the thickness or height of said collars. Since the collars accurately follow the edge of the first apertures, it is very readily possible to reduce the width of the dams which separate the first and second apertures to less than 1μ, irrespective of the shape of the apertures.

Of course, the performance of the method according to the invention requires a suitable choice of the etchants which are used, on the one hand for etching the material of the film in which the mask is formed and on the other hand for the removal of the islands with collars. The etchant which is used for etching the film should not attack the islands with collar to any appreciable extent, while conversely the etchant for removing the islands must leave the remaining parts of the film substantially undamaged.

When, for example, a film of silicon dioxide is used in which islands with a nickel collar are formed, it is advantageous to use a hydrofluoric acid solution for etching the silicon dioxide (HF attacks silicon dioxide much more rapidly than nickel), while for etching away the islands, for example, there is used nitric acid, or nitric acid with hydrogen peroxide.

It is to be noted that chemical etching is not the only process for obtaining narrow separation dams. The film parts between the islands may also be removed via ion etching and possibly by plasma sputtering. Due to the rather complicated type of the materials, however, which are required for the two last-mentioned methods, in particular for the ion etching, the said methods are used preferably only when the separation dams are to have a particularly small width (in the order of 0.5μ).

The method according to the invention may advantageously be used for manufacturing various types of semiconductor devices. Of particular advantage is the method according to the invention for manufacturing a field effect semiconductor device of vertical structure.

"Field effect devices of vertical structure" are to be understood to mean in particular transistors but also resistors of the varistor type which are formed in a wafer-like semiconductor body and which have a source zone and a drain zone, said two zones communicating with each other via a third zone extending transversely to the surface and termed the channel zone which is bounded by the gate region which is present within the semiconductor wafer and forms a rectifying junction with the channel zone.

In general, the three zones of a field effect semiconductor device of vertical structure, namely the source zone, the channel zone and the drain zone, are arranged one above the other in the direction of the thickness of a semiconductor wafer, the source zone adjoining a first surface of the said wafer and the drain zone adjoining the second surface of said wafer. The gate region is present in the interior of the wafer and extends parallel to the major surfaces thereof; hence it is a buried region which is realized in the form of a grid the meshes of which form the channels.

The device may also be manufactured in an epitaxial layer provided on a substrate. The drain zone in this case is present in the substrate, while the source zone is present at the surface of the epitaxial layer, or conversely.

In such a device the current flows from the source zone to the drain zone, normal to the plane of the semiconductor wafer.

A construction problem which all these known embodiments of field effect devices of vertical structure have in common is the realization of the control, by the gate region, of the current flowing in the channels, said control having to be as efficacious as possible. Said efficacy of the control by means of the gate region depends both on the diameter of each channel and on the length of said channels: it is obvious that the smaller the channels are and also the longer (higher) the channels are, the greater is the influence which is exerted by a potential variation of the gate region on the current which flows through the said channels.

In order to obtain a control by the gate region which is as efficacious as possible, it is known in practice that the ratio H/L, that is the ratio between the height (= length) H of the channels and the width dimension L thereof must be larger than 1.

On the other hand however, the high frequency behaviour of a device of the above-described type is better according as H is smaller.

So it is advantageous to make the width L as small as possible.

By known methods of manufacturing field effect devices of vertical structure the gate region is manufactured either by diffusion (according to methods known in semiconductor technology of obtaining a buried layer) or by ion implantation.

In all these cases, apertures have to be provided in the first instance in a masking layer (for example of silicon dioxide) which is provided on the surface to be treated, the diffusion or the ion implantation being then carried out via the said apertures. As already said, it is very difficult by means of the known masking technologies to provide apertures the dimension of which is smaller than 2μ and between which the distance is smaller than 2μ. As a result of this, the width of the channels which form the diffused or the implanted zones is, in general, larger than 2μ (in the order of 2.2 to 2.4μ).

By using the method according to the invention it is possible to reduce the channel width to less than 1μ.

Field effect devices of which the channels in the gate region show a width which is smaller than 1μ present performances especially at high frequencies which are much better than those of devices of the same type obtained according to known methods.

On the other hand, due to the fact that the width L of the channels of the gate region can be reduced to less than 1μ it is possible to reduce the height H of said channels to 1μ and less, while nevertheless the ratio H/L remains larger than 1. This facilitates the construction: when the gate region is obtained, for example by ion implantation, the implantation energy necessary to form the said region is smaller according as the height H itself is smaller.

The invention will now be described in greater detail with reference to the drawing, in which FIGS. 1a to 1e are detailed cross-sectional views of the manufacture of a mask used in the method according to the invention, said mask being shown in successive stages of its manufacture.

Figure 3A:
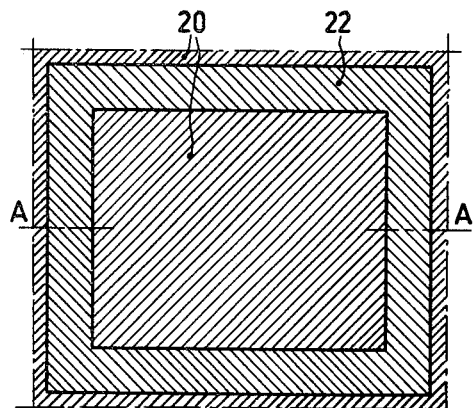
Figure 2A:
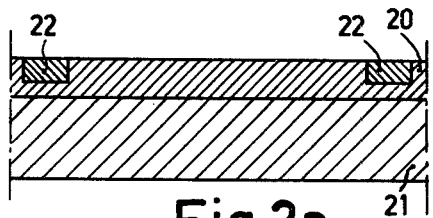
Figure 3B:
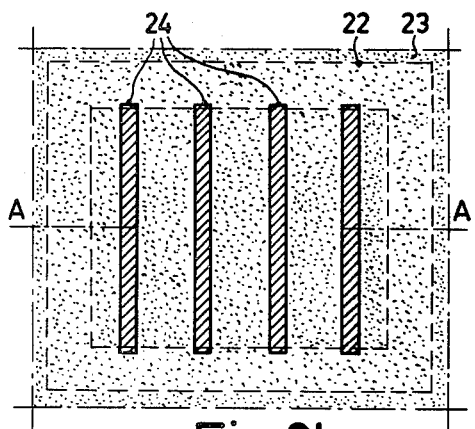
Figure 2B:
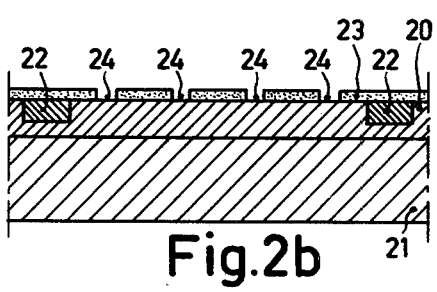
Figure 3C:
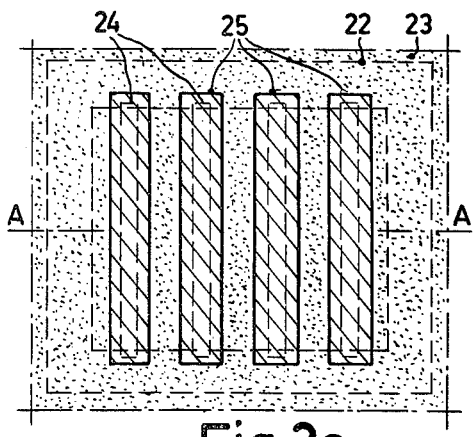
Figure 2C:
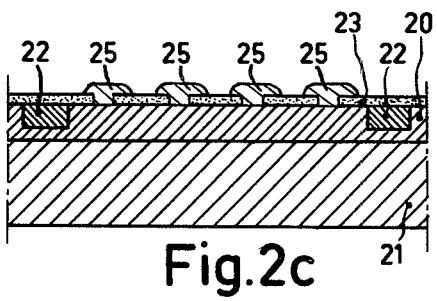
Figure 3D:
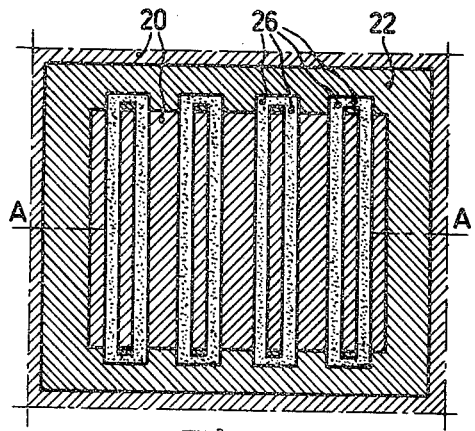
Figure 2D:
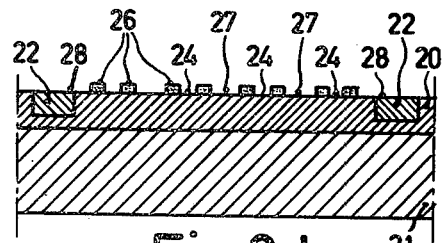
Figure 2E:
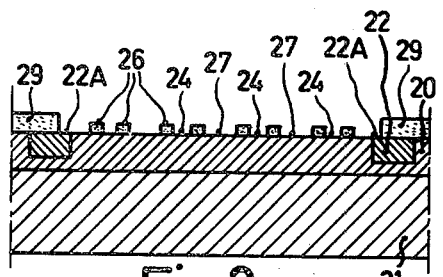
Figure 3E:
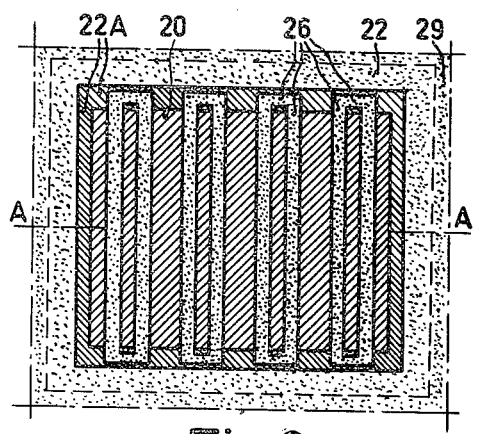
Figure 2F:
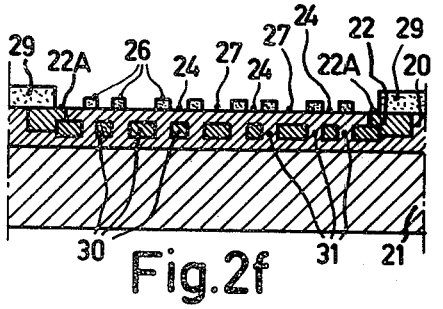
Figure 2G:
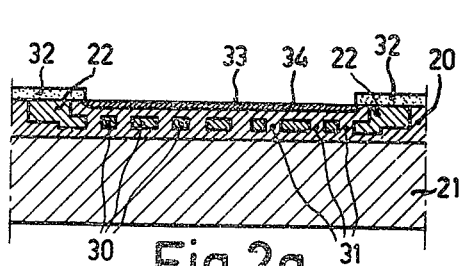
Figure 2H:
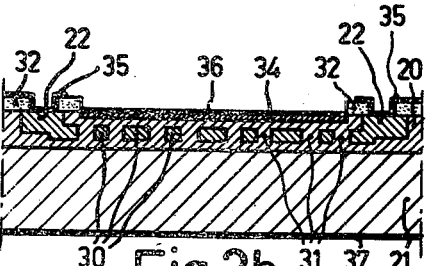

FIGS. 2a to 2h are diagrammatic cross-sectional views taken on the line AA of the FIGS. 3a to 3e of a semiconductor device according to the invention shown in successive stages of manufacture, FIGS. 3a to 3e are plan views of the device according to the invention which correspond to the FIGS. 2a to 2e (the plan view of FIG. 3e also corresponds to the cross-sectional view shown in FIG. 2f).

In the initial stage of the manufacture of the mask used in the method according to the invention, the insulating material forming said mask is provided in the form of a film 10, for example, of silicon oxide, with a substantially constant thickness on a surface 11A of a semiconductor substrate 11, for example, of silicon (see FIG. 1a).

Figure 1B:
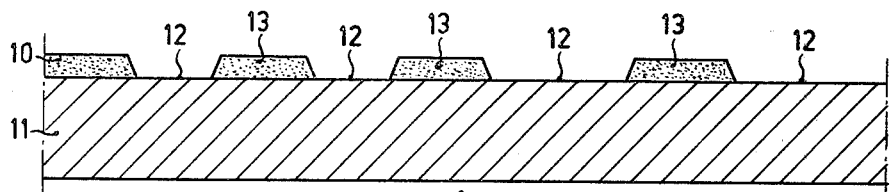

Via known photolithographic etching methods, first apertures 12 are provided in said film 10, for example, with different dimensions and with different intermediate distances (see FIG. 1b). Said apertures are separated from each other by parts 13 of the masking layer 10.

Figure 1C:
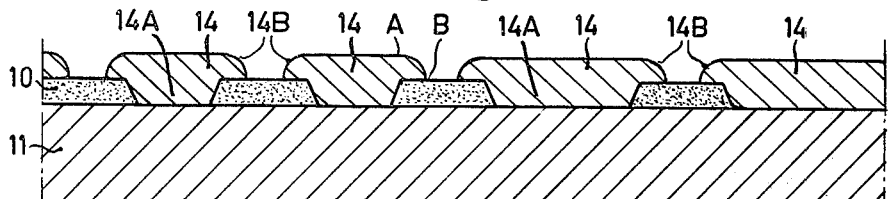
Figure 1D:
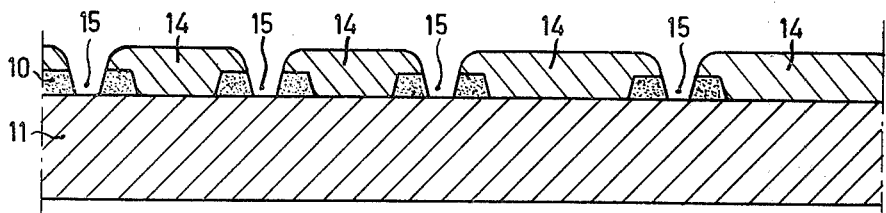

From the exposed parts of the surface 11A of the substrate 11, islands 14 with collars 14 of an isotropically growing material, for example nickel, are grown in said first apertures 12 (see FIG. 1c).

The islands 14 whose shape resembles that of mushrooms, each have on the one hand a base part 14A which is present in the space bounded by each aperture 12, and on the other hand a raised part which projects in thickness and in width beyond the said apertures 12 and which in this manner forms the collars 14B on the film 10.

Since the islands 14 are formed by an isotropically growing material, the dimensions of the collars 14B according to their thickness and their width directions are approximately equal, said width and thickness being measured from the upper side of the edge of the apertures 12.

In the next stage of the manufacture of the mask, the parts of the film 10 present between the collars 14B are removed, for example, by means of a HF solution (see FIG. 1d) without attacking the islands 14. In this manner the intermediate "second" apertures 15 are formed.

Finally the islands 14 are removed by etching, for examaple, with $HNO_3$. The remaining parts of the film 10 then form the mask (see FIG. 1e).

Said mask comprises apertures 12 (first apertures) and apertures 15 (second apertures) which are separated from each other by dams 16 having substantially the same thickness.

In this example the parts 13 which separate the apertures 12 of variable width from each other have the boundary width of, e.g., $2\mu$ at their tops. Taking into account the substantially unavoidable inclination of the walls of the apertures 12, the width of the parts 13 at the base thereof is brought, for example, at $2.4\mu$ (said base width varies on the one hand with the thickness of the film 10 and on the other hand with the etching conditions which influence the inclination of the walls). On the contrary, the width of the apertures 12 at the base thereof is reduced.

The islands 14 with collar have been obtained, for example, by growing nickel thermally or by electroplating. The said growth by electro-plating may be carried out, for example, in a bath of the composition:

| Nickel sulphate | 200 g/liter of water |
|---|---|
| Nickel fluoborate | 66 g/liter |
| Nickel chloride | 1 g/liter |
| Boric acid | 20 g/liter | at a temperature of approximately 60°C and an average electric current of approximately 35 mA/sq.cm.

In the case in which the walls 16 have a very small width ($0.5\mu$ or less at the top), it is desirable to replace the chemical etching of the silicon dioxide by etching via plasma sputtering. Etching occurs at an average rate of approximately 30A/min (in the case in which the film 10 consists of silicon nitride the etching rate is larger, namely approximately 300 A/min).

Figure 1E:
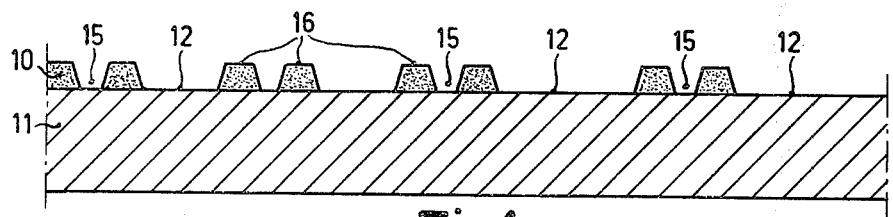

Assuming the width of the collars 14B of the islands 14 (which width is measured from the side A of the edges of the apertures 12 to the boundary line B of the islands 14, in which the letters A and B are shown in FIG. 1c) to be, for example, $0.5\mu$, a mask is obtained which corresponds to FIG. 1e and the apertures 15 of which have a width of $1\mu$ at the top and a width of $0.6\mu$ at the base. The dams 16 show a width of $0.5\mu$ at the top and a width of $0.9\mu$ at the base.

It will be obvious that for a given width of the parts 13 the width of the apertures 15 and the width of the dams 16 can obtain values different from those given above by way of example.

FIGS. 2a to 2h and 3a to 3e show the manufacture of a semiconductor device according to the invention. Starting material is an epitaxial monocrystalline layer 20 which is provided on a substrate 21. The said layer 20 and the substrate 21 are of a first conductivity type.

It is to be noted that in the said Figures the inclination of the walls of the apertures obtained via chemical etching has not been taken into account for simplicity of the drawings.

As shown in FIGS. 2a and 3a, first an annular zone 22 of the second conductivity type is formed in the layer 20, preferably via diffusion.

A film 23 of insulating material is then provided on the surface of layer 20 and of the zone 22, which film is impermeable to the ions which will be implanted afterwards to form the gate region of the semiconductor device. Apertures 24 (in this case four apertures) are then provided in the film 23 and extend from an edge of said zone 22 and continue up to the oppositely located edge and partly overhang said edge. The apertures 24 are preferably rectangular and regularly divided over the surface of the part of the layer 20 bounded by the zone 22 (see FIGS. 2b and 3b; in FIG. 3b the zone 22 present below the film 23 is shown in broken lines).

The next operation is the formation of islands 25 with collars in the apertures 24 via electrolytic or chemical growing (see FIGS. 2c and 3c; in FIG. 3c the zone 22 is shown in broken lines, while the apertures 24 are denoted by dotted lines).

After the formation of the islands 25 the parts of the film 23 not protected by said islands are removed (for example, by chemical etching or by plasma sputtering), while the islands themselves are then removed, for example, by chemical etching. Of the film 23 only the dams 26 (FIGS. 2d and 3d) are then left which fully surround the first apertures 24. In all the other places of the surface of the wafer the layer 20 and the zone 22 are exposed, namely in the intermediate second apertures which with the with the first apertures 24 (the space occupied by the apertures 27 corresponds to the parts of the film 23 which are not protected by the islands 25 and which were removed by etching or plasma sputtering), and at the circumference 28 of the device (see FIGS. 2d and 3d).

After the formation of the dams 26 a layer 29 is provided on the surface and consists of a material which is impermeable to the ions to be implanted afterwards, the layer 29 being formed, for example, by a photoresist of a suitable type and correct thickness which is etched in such a manner that the surface of the epitaxial layer 20 bounded by the zone 22 as well as a small part 22A of the zone 22 is again exposed (with the exception of the dams 26) (see FIGS. 2e and 3e).

The gate regions 30 of the device are then formed via ion implantation. For that purpose, a beam of ions which cause the second conductivity type is then directed onto the surface of the structure according to a direction which is substantially perpendicular to said surface. During said ion implantation both the dams 26 formed by the material which is impermeable to the said ions, and the photoresist layer 29 serve as a mask.

The gate region 30 has the shape of a grid the meshes 31 of which are present opposite to the dams 26 and have a width which corresponds to that of the said dams (see FIG. 2f). All the parts of the grid 30 are connected to at least two of the edges of the zone 22 present opposite to each other.

It will be obvious that the electric conditions in which the ion implantation is carried out should be such that the grid is at the correct level in the layer 20 and that said grid has the desired height.

It is known that, via ion implantation, a concentration of doping ions is obtained from the surface of a body, the distribution of which ions corresponds approximately to a Gauss function, the largest concentration in the body measured from the said surface being located at a distance which depends upon the energy level of the ions used. So from a given implantation depth a layer can be formed the charge carrier concentration of which is such that the original first conductivity type of the body is inverted. As a result of this a buried layer of the second conductivity type is obtained in a direct manner.

In the case in question of the manufacture of a field effect device of vertical structure, the energy level of the ions determines the thickness of the grid 30; the ion dose per sq.cm determines the charge carrier concentration in the said grid 30.

After the formation of the gate region 30, the dams 26 and the photoresist layer 29 which are present on the surface of the structure are removed. A layer 32 of insulating material is then provided on the surface and a window 33 is etched in it the boundary lines of which are parallel to the inner edge of the zone 22 and are present within the sides of said zone 22. In this manner the zone 22 is fully covered by the layer 32. Via the window 33 a doping material which causes the first conductivity type is then provided by ion implantation or by diffusion in those surface layers of the layer 20 which are exposed by the window. This doping which forms the highly doped zone 34 in FIG. 2g has a double purpose: on the one hand the object of the said doping is to obtain a surface compensation of the doping of the second conductivity type which is caused by the implantation of the grid 30; on the other hand the said zone 34 facilitates the provision of a contact on the surface of the layer 20.

The last operation to be carried out to manufacture the device is the provision of a metal contact 35 on the zone 22, a metal contact 36 on the zone 34 and a metal contact 37 on the rear face of the substrate 21. After these operations the field effect device of vertical structure has the shape as shown in the cross-sectional view of FIG. 2h. It has already been said above that the gate region of said device corresponds to the grid 30. The source zone is present between the contact 36 and the grid 30. The drain zone is present at the area of the part of the layer 20 which separates the grid 30 from the substrate 21. The contact 37 is the drain contact, the substrate 21 only serving as a connection zone with strong conductivity between the drain zone and the drain contact. It is to be noted that the drain contact could equally readily be provided on the surface of the layer 20 beyond the boundary lines defined by the zone 22.

The channel zone of the device is formed by the parts of the layer 20 which are present in the meshes or channels 31 of the grid 30.

Due to the method according to the invention the width of the channels 31 in said field effect device of vertical structure may be very small (to $0.4\mu$). In order to obtain a ratio H/L larger than 1, it is not necessary in this manner to perform the ion implantation at high energy.

For a concrete embodiment to which, however, the invention is not restricted, a few data are given hereinafter to manufacture the described field effect device of vertical structure.

A silicon wafer 21 of N conductivity type and having a resistivity of approximately 0.01 $\Omega$ cm is used for the manufacture of the described device. The epitaxial layer 20 which is also N conductive has a resistivity of approximately 5 $\Omega$ cm, while the thickness of said layer is from $1.8\mu$ to $2\mu$.

The P type conductive zone 22 is obtained by a boron diffusion; the depth of the zone is from $0.8\mu$ to $0.9\mu$.

The film 23 is of silicon oxide which is obtained, for example, by pyrolysis of silane or by oxidation. The thickness of the film 23 is approximately $0.8\mu$.

The P conductive grid 30 is obtained via implantation of boron ions. The implantation is carried out with an energy of approximately 150 keV (135 keV to 165 keV) and an ion dose of approximately $4.5.10^{14}$ atoms/sq.cm ($4.10^{14}$ to $5.10^{14}$ atoms/sq.cm). If desired said implantation is succeeded by annealing at 850°C for 20 minutes. In these circumstances the maximum concentration of the grid 30 is at a depth of $0.9\mu$ to $1.1\mu$.

The N conductive region 34 provided in the source zone is formed by ion implantation or diffusion. In the former case phosphorus ions, for example, are implanted with an energy of about 20 keV (18 to 22 keV) and an ion dose of about $1.5.10^{15}$ atoms/sq.cm ($1.10^{15}$ to $2.10^{15}$ atoms/sq.cm). Said implantation is succeeded by an annealing treatment at 800°C for 20 minutes.

It is also possible to use arsenic ions with an energy of about 80 keV (75 to 85 keV) and an ion dose of about $2.5.10^{15}$ atoms/sq.cm ($2.10^{15}$ to $3.10^{15}$ atoms/sq.cm). In this case annealing is carried out at 800°C and also for 20 minutes.

In the latter case, so in the case of diffusion, the volume 34 is formed, for example, by diffusion of arsenic from doped silicon oxide. The annealing is carried out at 950° for 10 to 20 minutes.

The thickness of the zone 34 is approximately $0.2\mu$ (0.2 to $0.25\mu$).

The width of the channels 31 of the grid 30 depends on the dimensions of the collars of the islands 25. In the above described conditions and data regarding the essential parts of the device, and in the case of islands 25 having an overall thickness of, for example, $1.4\mu$, which means for the collars a height above the surface of the layer 23 (and a width) of $0.6\mu$, channels 31 are obtained whose width is equal to $0.6\mu$ to $0.8\mu$, taking into account the stray effects which are due to lateral diffusion and to the inclination of the walls 26.

It is furthermore to be noted that the use of a mask according to the invention does not exclude the possibility of manufacturing a field effect device of vertical structure in a manner other than by ion implantation. Actually it is possible to diffuse the grid 30 via the aperture of the mask formed by the dams 26, said diffusion being succeeded, for example, by the growth on the layer of an epitaxial region which forms the source zone.

Of course the invention is not restricted to the embodiments described since many variations are possible to those skilled in the art without departing from the scope of this invention. In the embodiment described, after providing both the first and the second apertures, the same doping material was provided through said apertures. In certain circumstances, however, it may be advantageous to temporarily close one or more of the first apertures (for example with a layer of lacquer or an oxide layer), or to leave them closed (by the islands grown therein) and first to provide a doping material via the second apertures and then, via the opened and reopened, respectively, first apertures, to provide the same or a different doping material, after having or not having provided the second apertures with a masking.

What is claimed is:

1. A method of manufacturing a semiconductor device, comprising the steps of:
    a. providing a semiconductor body having a first surface;
    b. providing a masking layer on said first surface;
    c. providing at least a first aperture in said masking layer;
    d. forming in said first aperture an island of an isotropically growing material, said step of forming said island being carried out until said island extends beyond the edge of said masking layer and forms on said masking layer a collar that is disposed at the edge of said aperture, parts of said masking layer remaining uncovered by said island;
    e. removing said uncovered parts of said masking layer to form therein at least one second aperature;
    f. removing said islands; and
    g. providing doped zones in said semiconductor body via said first and second apertures, by introducing therethrough at least one doping material into said body.

2. A method as in claim 1, wherein after providing said first and second apertures, the same dopant is introduced into the body through all of said apertures.

3. A method as in claim 1, wherein said uncovered parts of the masking layer are thus removed by etching.

4. A method as in claim 1, wherein said uncovered parts of said masking layer are thus removed by plasma sputtering.

5. A method as in claim 1, wherein said doping material is thus introduced by ion implantation.

6. A method as in claim 1, wherein the width of said collar is smaller than $1\mu$.

7. A method as in claim 1, for manufacturing a field effect device comprising at least one channel region and gate region and of which the channel current direction is substantially normal to said semiconductor surface, wherein said semiconductor body comprises a semiconductor region of first conductivity type adjoining said surface and said method, further comprising the step of forming said gate region which forms a P-N junction with said channel region by introducing a second opposite conductivity type determining dopant in said surface-adjoining semiconductor region via said first and second apertures of said mask.

8. A field effect device manufactured according to the method of claim 7.

9. A field effect device ad in claim 8, wherein the dimension transverse to the channel flow direction of said channel region is less than $1\mu$.

* * * * *